United States Patent
Zampini et al.

(10) Patent No.: US 6,844,270 B2
(45) Date of Patent: Jan. 18, 2005

(54) POLYMERS AND PHOTORESIST COMPOSITIONS FOR SHORT WAVELENGTH IMAGING

(75) Inventors: Anthony Zampini, Westborough, MA (US); Sungseo Cho, Milford, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/994,130

(22) Filed: Nov. 26, 2001

(65) Prior Publication Data

US 2002/0081499 A1 Jun. 27, 2002

Related U.S. Application Data

(60) Provisional application No. 60/253,237, filed on Nov. 26, 2000.

(51) Int. Cl.[7] .......................... H01L 21/31; H01L 21/469
(52) U.S. Cl. ........................ 438/781; 438/780; 438/948; 438/725
(58) Field of Search ................................ 438/780, 781, 438/725, 945, 942, 948; 430/270.1, 311, 313

(56) References Cited

U.S. PATENT DOCUMENTS

| | | | | |
|---|---|---|---|---|
| 5,731,364 A | * | 3/1998 | Sinta et al. | 522/31 |
| 5,916,995 A | * | 6/1999 | Park et al. | 528/104 |
| 6,133,412 A | * | 10/2000 | Malik et al. | 528/425 |
| 6,277,750 B1 | * | 8/2001 | Pawlowski et al. | 438/689 |
| 6,495,298 B1 | * | 12/2002 | Fujishiro et al. | 430/7 |
| 6,541,181 B1 | * | 4/2003 | Levanon et al. | 430/275.1 |

* cited by examiner

*Primary Examiner*—Caridad Everhart
(74) *Attorney, Agent, or Firm*—Peter F. Corless; Edwards & Angell, LLP

(57) ABSTRACT

The present invention includes polyacetal polymers and photoresist compositions that include the polymers as a resin binder component. Photoresists of the invention include chemically-amplified positive-acting resists that can be effectively imaged at short wavelengths such as sub-300 nm, particularly 157 nm.

16 Claims, No Drawings

POLYMERS AND PHOTORESIST COMPOSITIONS FOR SHORT WAVELENGTH IMAGING

This application claims the benefit of provisional application Ser. No. 60/253,237 filed Nov. 26, 2000.

BACKGROUND OF THE INVENTION

1. Field of the Invention

The present invention relates to new polymers and use of such polymers as a resin component for photoresist compositions, particularly chemically-amplified positive-acting resists that feature good solubility characteristics and can be effectively imaged at short wavelengths such as sub-300 nm and sub-200 nm, including 248 nm, 193 nm and especially 157 nm. Polymers of the invention include fluorine-containing homopolyacetals and copolyacetals.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

More recently, chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer. See also R. D. Allen et al., Proceedings of SPIE, 2724:334–343 (1996); and P. Trefonas et al. Proceedings of the 11th International Conference on Photopolymers (Soc. Of Plastics Engineers), pp 44–58 (Oct. 6, 1997).

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 300 nm or less, such as wavelengths of about 248 nm (provided by KrF laser) or 193 nm (provided by an ArF exposure tool). See European Published Application EP915382A2. Use of such short exposure wavelengths can enable formation of smaller features. Accordingly, a photoresist that yields well-resolved images upon 248 nm or 193 nm exposure could enable formation of extremely small (e.g. sub-0.25 $\mu$m) features that respond to constant industry demands for smaller dimension circuit patterns, e.g. to provide greater circuit density and enhanced device performance.

However, many current photoresists are generally designed for imaging at relatively higher wavelengths, such as G-line (436 nm) and I-line (365 nm) are generally unsuitable for imaging at short wavelengths such as sub-300 nm. Even shorter wavelength resists, such as those effective at 248 nm exposures, also are generally unsuitable for sub-200 nm exposures, such as 193 and 157 nm imaging.

More specifically, current photoresists can be highly opaque to extremely short exposure wavelengths such as 157 nm, thereby resulting in poorly resolved images.

Additionally, cleavage of the blocking group alone has not always provided desired solubility characteristics in exposed and unexposed areas of the resist coating layer.

It thus would be desirable to have new photoresist compositions, particularly resist compositions that can be imaged at short wavelengths such as sub-300 nm and sub-200 nm exposure wavelengths, including 248 nm, particularly 193 nm and especially 157 nm.

SUMMARY OF THE INVENTION

The invention includes new fluorine-containing homopolyacetals and copolyacetals, including aromatic fluorine-containing homopolyacetals and copolyacetals and use of such polymers as a resin components of positive-acting and negative-acting photoresists, including resists imaged at sub-300 nm and sub-200 nm wavelengths such as 248 nm, 193 nm and 157 nm. As used herein, the term polyacetal as used herein is inclusive of e.g. the reaction product of a polyol and reactive methylene or keto (e.g. aldehyde) compound, e.g. the reaction product of a resorcinol and a benzylhalide (a reactive methylene compound). The term acetal as used herein also is inclusive of ketals.

Polymers of the invention may be comprised of a wide variety of units. Preferred polymers contain polymerized units of alcohols or thiols, particularly polyols, especially aromatic compounds having multiple hydroxy groups, typically 2, 3, or 4 hydroxy groups. Such compounds also preferably will have one or more electronegative substituents, particularly halo especially fluoro, and haloalkyl such as halo($C_{1-12}$alkyl) preferably fluoro($C_{1-12}$alkyl) e.g. —$CF_3$ and other perfluoro($C_{1-12}$alkyl).

More particularly, di-alcohols, phenols including bisphenols and resorcinols, dicarboxylic acids (also referred to herein as a polyol) such as tetrafluoroisophthalic acid and tetrafluorsuccinic acid and other phthalic and succinic acids, thiol monomers, and halobenzyl compounds, all of which may be fluorinated or substituted with one or more other electronegative groups, may be condensed to provide a polymer of the invention. In addition to fluorine and fluoroalkyl, polymers of the invention may contain other electron-withdrawing groups such as other halogen, nitro, cyano, haloalkyl such as halo($C_{1-12}$alkyl) other than fluoroalkyl), sulfinyl and alkylsulfinyl such as ($C_{1-8}$alkyl) sulfinyl, sulfonyl and alkylsulfonyl such as ($C_{1-8}$alkyl) sulfonyl etc. Preferred fluorine substituent groups may be present as fluorine, or a fluoroalkyl particularly fluoro($C_{1-12}$alkyl), especially perfluoro($C_{1-12}$alkyl) such as —$CF_3$.

Particular polymers of the invention comprise aromatic groups, such as phenyl, phenol, naphthylene, etc. Polymers of the invention also may comprise non-aromatic groups such as alicyclic groups, e.g. adamantly, norbornyl, and the like. Such polymers and polymer units preferably include one or more electron-withdrawing groups, such as a halogen, nitro, cyano, sulfinyl, sulfonyl, and the like. Halogen, particularly fluoro, and fluoro($C_{1-12}$alkyl) such as —$CF_3$ are especially preferred groups. Additional examples of acceptable electronegative groups are provided below.

Particular polymers of the invention also may include repeat units of divinyl, dithiols, alicyclic, and cyclic alkyl groups such as adamantyl and norbornyl. Such groups are preferably substituted by one or more electronegative substituents, such as fluorine or fluoroalkyl. Preferred are polymers that include repeat units of a group that can form an acetal or ketal under polymerization or co-polymerization conditions.

For example, one polymer class of the invention includes units formed by co-polymerizing a divinyl ether group with a diphenolic, diol, dithiol, alicyclic, cyclic alkyl, or dicarboxylic acid. In one embodiment, hydrogen atoms on the divinyl ether group are substituted (fully or partially) with at least one of fluorine atom and/or fluorinated lower alkyl. The co-polymer thus formed features acceptable absorbance in the sub-300 nm and sub-200 nm range, particularly at 193 nm and 157 nm. As discussed, such polymers also include an acid labile acetal or ketal group that renders same significantly base soluble.

The invention also provides methods for forming relief images, including methods for forming a highly resolved relief image such as a pattern of lines where each line has essentially vertical sidewalls and a line width of about 0.40 microns or less, and even a width of about 0.25, 0.20 or 0.16 microns or less. The invention further provides articles of manufacture comprising substrates such as a microelectronic wafer substrate or liquid crystal display or other flat panel display substrate having coated thereon a polymer, photoresist or resist relief image of the invention.

Other aspects of the invention are disclosed infra.

DETAILED DESCRIPTION OF THE INVENTION

The invention includes a variety of homopolyacetals and copolyacetals, which are substituted with electron-withdrawing groups, particularly fluorine include of F and fluoroalkyl.

A wide of compounds may be reacted to provide a polymer of the invention, including polyhydroxy compounds, particularly di-alcohols and polyhydroxyaromatic compounds such as bisphenols and the like. Polymers containing hexafluoroisopropylidene groups particularly suitable, including polyketones, polyazomethines, polybenzimidazoles, and polybenzothiazoles, and copolymers thereof. Preferred reagents for synthesis of polymers of the invention include polyhydroxyaromatic compounds such as bisphenol compounds and halobenzyl compounds such as benzylchloride, which preferably may be ring substituted by F or fluoro($C_{1-12}$alkyl) particularly perfluoro($C_{1-12}$alkyl) such as —$CF_3$.

The polymers and co-polymers of the invention can be prepared by one or a combination of general strategies. For example, such compounds can be made by mixing the diphenol, diol, dithiol, or dicarboxylic acid compound with an equivalent amount of a vinyl compound at room temperature. Reaction times are from 3 to 24 hours and the compounds may be recovered by evaporation, all in accordance with conventional condensation procedures. See the examples which follow for exemplary preferred conditions.

A preferred synthesis included reaction of a polyol or thiol compound, such as an aromatic polyol e.g. a bisphenol, resorcinol, etc. with a reactive methylene compound or an aldehyde compound, e.g. a halobenzyl compound or an aldehyde preferably substituted with one or more electron-withdrawing groups to promote polyacetal formation with the polyol. Exemplary aldehydes include e.g. CHO($CF_3$), aromatic aldehyde such as benzaldehyde ring-substituted with one or more electron-withdrawing groups such as F, —$CF_3$ and other fluoro($C_{1-12}$alkyl). Aliphatic aldehydes also may be employed. Non-aromatic polyol compounds also can be employed to react with a methylene or aldehyde compound, such as $HOCH_2(CH_2)_nCH_2OH$, where n is an integer of from 0 to about 20, preferably 0 to about 8, more preferably 1 to about 8, and where one or more of the $CH_2$ groups may be substituted, e.g. by an electronegative substituents such as fluorine or fluoro($C_{1-12}$alkyl). One or each of the polymerization reagents is preferably substituted with one or more electronegative groups, e.g. a fluorine or other halogen, or haloalkyl such as halo($C_{1-12}$alkyl), particularly fluoro($C_{1-12}$alkyl) e.,g. —$CF_3$ and other perfluoro($C_{1-12}$alkyl).

The reaction may be conducted under basic conditions and in the presence of a suitable solvent such as NMP, DMF and the like. See, for instance, Example 3 which follows for an exemplary preferred synthesis.

Exemplary preferred reagents for preparation of polymers of the invention include the following:

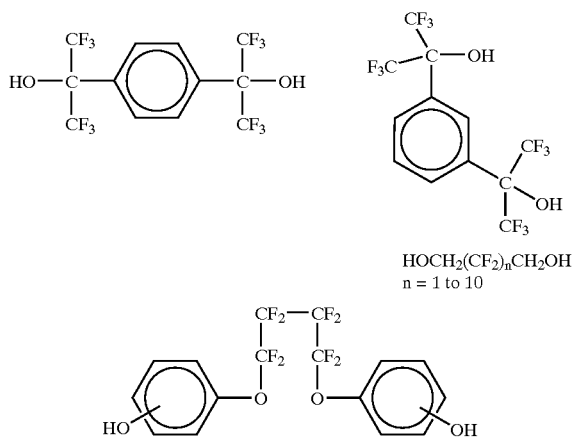

-continued

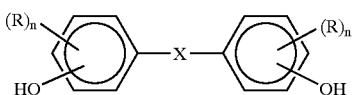

wherein:
each n is independently 0, 1, 2, 3 or 4
each R is independently OH, F
  of fluoro(C$_{1-12}$ alkyl)
X is a chemical bond of methylene optionally fluorinated

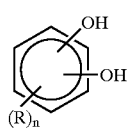

n is 0, 1, 2, 3 or 4
each R is independently
OH, F or fluoro(C$_{1-12}$ alkyl)

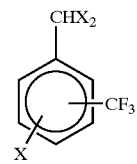

each X is independently
—CF$_3$ or other fluoro(C$_{1-12}$ alkyl),
F, NO$_2$, CN, Br, Cl, I, H

where R is preferably
electronegative group such as
fluoro(C$_{1-12}$ alkyl) e.s. —CF$_3$ A preferred synthesis of the invention is illustrated in the following Scheme to provide the depicted homopolyacetal:

Scheme

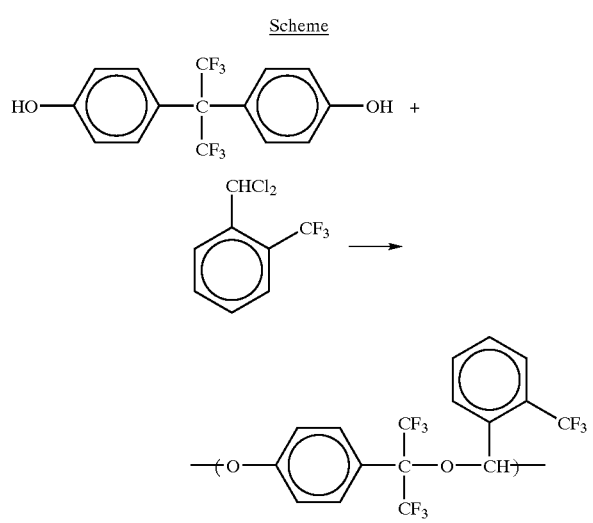

The above Scheme depicts reaction with preferred fluorinated reagents. In addition to the depicted trifluoromethylbenzylchloride compound, other reactive methylene compounds can be similarly copolymerized with other polyol compounds such as another bisphenol such as bisphenol-A, a dihydroxybenzene compound such as a resorcinol, dicarboxylic acid compounds such as tetrafluoroisophthalic acid or tetrafluorosuccinic acid, a non-aromatic polyol (e.g. di-alcohol) such as HOCH$_2$(CH$_2$)$_n$CH$_2$OH as discussed above, or a dithiol monomer.

Additional exemplary syntheses include the following:

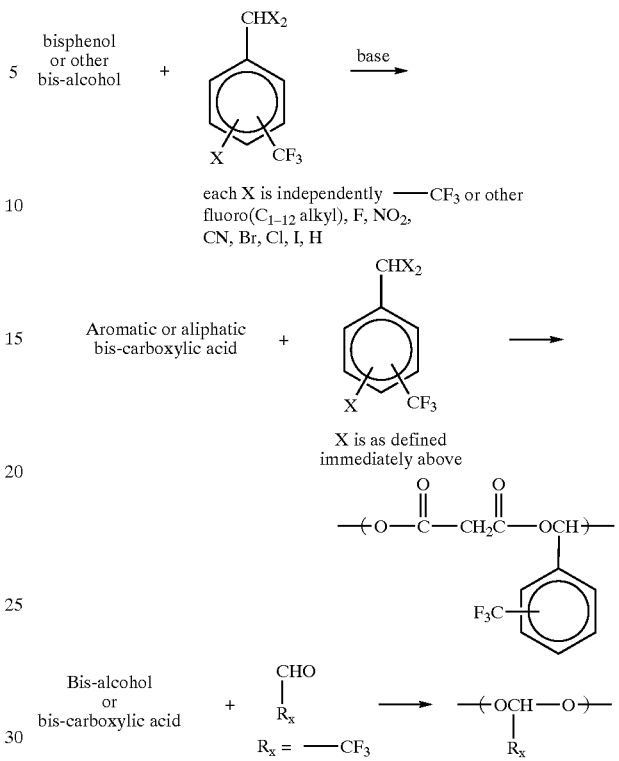

Synthesis of polymers of the invention also may include functional group of a divinyl compound with a corresponding reactive group on the diphenol, diol, dithiol, alicyclic, cyclic alkyl or carboxylic acid group. Each of said groups is optionally substituted with at least one electronegative group as defined herein. Generally, the reaction will be an acid catalyzed polyaddition between a vinylic carbon and a suitable hydroxyl, carboxylic or thiol substituent to form the desired labile acetal or ketal group. The divinyl group is bonded to hydrogen if it is a terminal group or bonded to a fragment of a suitable organic compound if it is a divalent internal group. Such vinyl compounds, including preferred divinyl ethers, may have one or more vinyl groups including more than one divinyl ether groups.

Particular polymers and co-polymers of the invention include one or more repeat units that comprise at least one electronegative group which group typically includes an electronegative atom such as a halogen (F, Cl, Br, I). Fluorine is an especially preferred electronegative atom. In cases in which the electronegative group is halogen, usually less than about twenty five (25) atoms will be employed, preferably less than about twelve (12) of such atoms with less than about six (6) to nine (9) often being useful. Additionally preferred electronegative groups include lower alkyl and lower alkoxy that have been substituted (partially or fully) with halogen, typically fluorine with the proviso that bonded fluorine atoms are preferably not made photolabile.

As discussed above, polymers of the invention may include other units, including alicyclic units such as adamantyl, norbomene, cyclohexanyl, cyclobutyl, dicyclohexane (preferably in which one ring is joined at the para position of the other ring), and the like.

Illustrative fluoroalkyl groups in accord with the invention include, but are not limited to, trifluoromethyl, difluoromethyl, monofluoromethyl, pentafluoroethyl, tetrafluoroethyl, trifluoroethyl, diflouroethyl, monofluoroethyl and the like.

Polymers of the invention also may be employed for dielectric composition applications, including low dielectric constant ("k") materials. A low dielectric material has been recognized as a material having a dielectric constant less than 4. The polymers of the invention may be used to provide thin film dielectric materials, including insulators, anti-reflective coatings, sound barriers, thermal breaks, insulation, optical coatings and the like. Polymers of the invention also may be employed for dielectric materials useful in electronic devices including, but not limited to, the fabrication of multilevel integrated circuits, e.g. memory and logic chips.

As discussed, the invention also encompasses photoresist compositions that include the polymers and co-polymers disclosed herein. In one embodiment, the photoresists constitute from 65 to 98 percent by weight of the polymer or co-polymer solid, preferably, from 75 to 98 percent by weight of total solids and more preferably, from about 85 to 96 percent by weight of the solids. In another embodiment, the polymer and co-polymers are provided as an additive to e.g, a phenolic or other conventional resin the field, preferably less that about 70% of the total solids, more preferably between from about 10% to about 50% of the solids.

More particular photoresist compounds in accord with the invention include at least one photoactive compound such as those discussed in more detail below. Preferably, such a compound would comprise from about 2 to 20 percent by weight and preferably from 4 to 10 percent by weight. In addition to the resin binder and photoactive compound, the balance of the composition would comprise other components conventionally added to photoresists as would be known to those skilled in the art. Typical additives include surfactants, dyes, sensitizers, etc.

An objective of the invention is to provide new polymers that exhibit the required absorbance, dissolution characteristics and etching resistance necessary to produce a high resolution photoresist. In one aspect, the invention features polymers and photoresist compositions that include polymers functionalized with at least one electronegative group as defined herein, typically fluorine atom or fluoroalkyl.

As discussed, the invention encompasses photoresist compositions (G/I-line, DUV, 193 nm and 157 nm) containing one or more polymers of the invention. As an additive to a photoresist, polymers of the invention may be used to reduce thermal flow temperature, improve scratch resistance (e.g., in PWB applications), improve dry or wet etch properties as well as contrast. In addition, polymers of the invention may also be used in bottom or top antireflection applications either alone or as an admixture.

As discussed, various moieties may be optionally substituted. A "substituted" substituent may be substituted at one or more available positions, typically 1, 2, or 3 positions by one or more suitable groups such as e.g. halogen (particularly F, Cl or Br); $C_{1-8}$ alky; $C_{1-8}$ alkoxy; $C_{2-8}$ alkenyl; $C_{2-8}$ alkynyl; hydroxyl; alkanoyl such as a $C_{1-6}$ alkanoyl e.g. acyl and the like; etc.

More specific substitutions in accord with the invention are fluorine atom, fluorinated lower alkyl, perfluoroalkyl, perfluoroalkylene, fluorinated cycloalkyl, and fluorinated ethers and esters including fluorinated cyclic ethers and fluorinated cyclic esters.

Preferably a polymer of the invention will have a weight average molecular weight ($M_w$) of about 800 or 1,000 to about 100,000, more preferably about 2,000 to about 30,000, still more preferably from about 2,000 to 15,000 or 20,000, with a molecular weight distribution ($M_w/M_n$) of about 5 or less, more preferably a molecular weight distribution of about 2 or less. Molecular weights (either $M_w$ or $M_n$) of the polymers of the invention are suitably determined by gel permeation chromatography.

Polymers of the invention used in photoresist formulations should contain a sufficient amount of photogenerated acid labile groups to enable formation of resist relief images as desired. For instance, suitable amount of such acid labile groups will be at least 1 mole percent of total units of the polymer, more preferably about 2 to 40, 50, 60 or 70 mole percent, still more typically about 3 to 30, 40, 50, 60 or 70 mole percent of total polymer units. See the examples which follow for exemplary preferred polymers.

As discussed above, the polymers of the invention are highly useful as a resin binder component in photoresist compositions, particularly chemically-amplified positive resists. Photoresists of the invention in general comprise a photoactive component and a resin binder component that comprises a polymer as described above.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

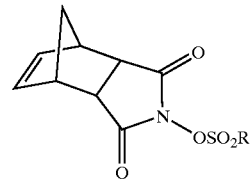

wherein R is camphor, adamantane, alkyl (e.g. $C_{1-12}$alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

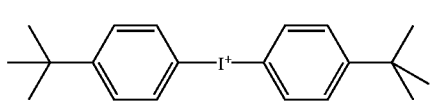

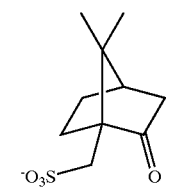

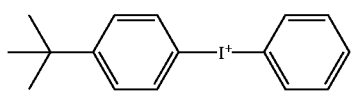

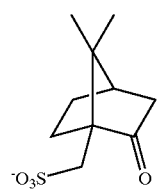

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3^-$ where R is adamantane, alkyl (e.g. $C_{1-12}$alkyl) and perfluoroalkyl such as perfluoro ($C_{1-12}$alkyl), particularly perfluorooctanesulfonate, perfluorobutanesulfonate and the like.

Other known PAGS also may be employed in the resists of the invention. Particularly for 193 nm and 157 nm imaging, generally preferred are PAGS that do not contain aromatic groups, such as the above-mentioned imidosulfonates, in order to provide enhanced transparency.

Photoacid generators will be selected for such factors as absorbance, quantum efficiency, outgassing during exposure and acid strength. By far, the most promising class of photoacid generators at 157 nm comprises the "onium" salts. These materials frequently have lower than expected absorbance and are usually present in the resist at levels less than 5% by weight of solids. These materials consist of combinations of independently variable cations and anions that include the following:

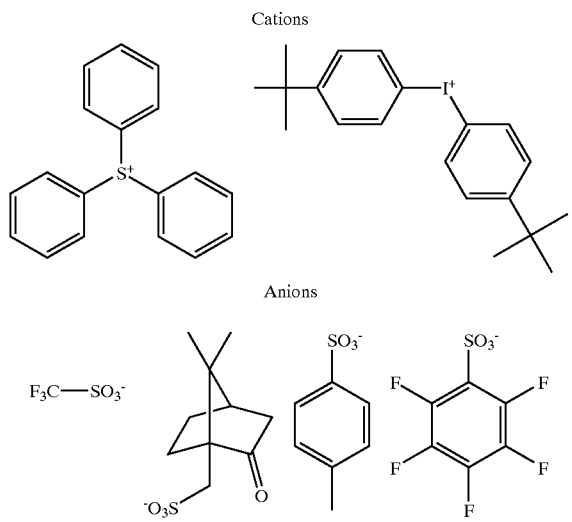

The choice of photoacid generator affects out-gassing of the resist during exposure, not only because of the direct photolysis products from the PAG decomposition but because stronger acids tend to make the deprotection traction more facile. The choice of PAG will depend strongly on its influence on out-gasing.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The resists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate, 3-ethoxyethyl propionate, cyclohexanone or 2-heptanone. Ethyl lactate, cyclohexanone and 2-heptanone are generally preferred for formulating resists to be imaged at 157 nm. Typically, the solids content of the composition varies between about 5 and 35 percent by weight of the total weight of the photoresist composition. The resin binder and photoactive components should be present in amounts sufficient to provide a film coating layer and formation of good quality latent and relief images.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 $mJ/cm^2$, dependent upon the exposure tool and the components of the photoresist composition.

As discussed above, coating layers of the resist compositions of the invention are preferably photoactivated by a short exposure wavelength, particularly a sub-300 and sub-300 nm exposure wavelength, and even sub-170 nm wavelength. As discussed above, 157 nm is a particularly preferred exposure wavelength. However, the resist compositions of the invention also may be suitably imaged at higher wavelengths. For example, a resin of the invention can be formulated with an appropriate PAG and a sensitizer if needed and imaged at higher wavelengths such as about 193 nm or 248 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

EXAMPLE 1

Acid-catalyzed Addition Copolymerization of Ethylene Glycol Divinyl Ether (EGDE) and Dihydroxy Phenyl Ether (DHPE).

In a 100 mL three-neck round bottom flask were added 3.54 g (17.52 mmol) of dihydroxy phenyl ether (DHPE), 2.00 g (17.52 mmol) of ethylene glycol divinyl ether (EGDE), and 7 mL of dry tetrahydrofuran (THF). The reaction vessel was then purged with nitrogen and the reaction mixture was kept under inert atmosphere. A catalytic amount (ca. 0.1 mL) of trifluoroacetic acid (TFA) was added and the reaction mixture was stirred for 24 h at 22° C. An excess amount (ca. 0.5 mL) of EGDE was added to the reaction mixture and stirred for 2 h. The reaction mixture was neutralized with sodium ethoxide-ethanol solution. The solution was precipitated in 400 mL of deionized water and stirred for an hour. Sticky white precipitate was then washed with 400 mL of deionized water with stirring. Overnight air-drying gave 3.46 g of white solid (63% yield) and the product is being dried under vacuum at 25° C.

The foregoing EGDE and DHPE co-polymer can be employed in many photoresist applications intended for 240 nm imaging. For effective imaging at shorter light wavelength such as below 300 nm and especially 194 nm and 157 nm, hydrogen atoms in the co-polymer can be substituted with electronegative groups such as fluorine atom and/or fluorinated lower alkyl. Fully substituted co-polymer will be especially useful for 157 nm applications in which minimal light absorbance is desired.

EXAMPLE 2

Acid-catalyzed Addition Copolymerization of Ethylene Glycol Divinyl Ether (EGDE) and 4,4'-(hexafluoroisopropylidene)-diphenol.

In a 100 ml three-neck round bottom flask were added 2.95 g (8.76 mmol) of 4,4'-(hexafluoro-isopropylidene)-dephenol, 1.00 g (8.76 mmol) of ethylene glycol divinyl ether (EGDE), and 7 ml of dry tetrahydrofuran (THF). The reaction vessel was then purged with nitrogen and the reaction mixture was kept under inert atmosphere. A catalytic amount (ca. 0.1 ml) of trifluoroacetic acid was added and the reaction mixture was stirred for 24 hr at 22° C. An excess amount (ca. 0.5 ml) of EGDE was added to the reaction mixture and stirred for an hour. The reaction mixture was divided into two parts, one of which was neutralized with sodium ethoxide-ethanol solution. The other part was treated with ammonium hydroxide. Both THF solutions were precipitated in 400 ml of deionized water, respectively, and stirred for an hour. Sticky white precipitate was then washed with 400 ml of deionized water, with stirring and air-dried for an hour. Vacuum during for 48 hrs at 25° C. gave 1.94 g (NaOEt treated) and 1.57 g ($NH_4OH$ treated) of white solid. Overall yield: 89%. Molecular weight: $M_w$ 9300 $M_n$ 4400 PD 2.11 (NaOEt treated), $M_w$ 7900 $M_n$ 3900 PD 2.01 ($NH_4OH$ treated).

EXAMPLE 3

Homopolyacetal from Bisphenol AF and 2-(trifluoromethyl) benzyl Chloride.

The procedure of Y. Saegusa et al. Journal of Polymer Science: Part A: Polymer Chemistry, vol 38, 1873–1879 (2000) can be followed. Briefly, into a dry 30-ml three-necked flask is charged bisphenol AF (2.52 g, 7.50 mmol), 2-trifluoromethyl)benzyl chloride (2.29 finely pulverized 85% potassium hydroxide (1.32 g, 20.0 mmol), 18-crown-6 ether (0.198 g, 0.750 mmol) and N-methyl pyrrolidinone (5 ml). The mixture is heated to 100° C. under nitrogen and stirred at that temperature for 3 hours. After cooling to ambient temperature, the resulting solution is diluted with N-methyl pyrrolidinone (10 ml) and then poured into methanol (300 ml) to precipitate the polymer. The polymer can be further purified by repeated repercipitations with N-methyl pyrrolidinone and methanol.

The foregoing description of the invention is merely illustrative thereof, and it is understood that variations and modifications can be effected without departing from the spirit or scope of the invention as set forth in the following claims.

What is claimed is:

1. A method for forming a photoresist relief image, comprising:
    (a) applying a photoresist composition on a substrate, the photoresist comprising an aromatic resin and a photoactive component, the resin obtainable from reaction of i) a polyol and/or thiol, and ii) and a reactive methylene or keto compound, at least one of the polyol and methylene compound having one or more electronegative substituents, and
    (b) exposing the photoresist to activating radiation having a wavelength of less than 300 nm and developing the exposed photoresist layer.

2. The method of claim 1, wherein the photoresist is exposed with radiation having a wavelength of less than about 260 nm.

3. The method of claim 1, wherein the photoresist is exposed with radiation having a wavelength of less than about 200 nm.

4. The method of claim 1, wherein the photoresist is exposed with radiation having a wavelength of about 157 nm.

5. The method of claim 1 wherein the resin comprises phenolic units.

6. The method of claim 1 wherein the polyol is an aromatic compound.

7. The method of claim 1 wherein the polyol is a bisphenol, a polyhydroxybenzene or a polycarboxylic acid compound.

8. The method of claim 1 wherein the methylene compound or keto compound is a benzyl compound, or an aldehyde substituted with one or more electronegative groups.

9. The method of claim 1 wherein the resin comprises halogen, halogenated lower alkyl, nitro, cyano, sulfinyl, O—C—O or sulfonyl groups.

10. The method of claim 1 wherein the resin comprises at least one of fluorine atom, fluorinated lower alkyl, perfluoroalkyl, perfluoroalkylene, fluorinated cycloalkyl, and fluorinated ethers and esters including fluorinated cyclic ethers and esters.

11. The method of claim 1 wherein the resin comprises acrylate units.

12. The method of claim 1 wherein the resin is a homopolyacetal.

13. The method of claim 1 wherein the resin is a copolyacetal.

14. The method of claim 1 wherein the polymer is chemically amplified positive resist.

15. The method of claim 1 wherein the polymer is a negative resist.

16. A method of forming a positive photoresist relief image, comprising:

(a) applying a coating layer of a photoresist composition on a substrate, the photoresist composition comprising a photoactive component and a resin comprising a polymer that comprises repeat units of:

1) an active methylene or aldehyde or other carbonyl compound that forms an acetal group in a polymerization or co-polymerization reaction; and 2) a polyol or thiol that reacts with the methylene or aldehyde or other carbonyl compound to form the acetal group; and (b) exposing and developing the photoresist layer to yield a positive-tone relief image, wherein the photoresist layer is exposed with radiation having a wavelength of less than about 300 nm.

* * * * *